United States Patent
Golay et al.

(10) Patent No.: US 7,071,689 B2
(45) Date of Patent: Jul. 4, 2006

(54) METHODS FOR MULTIPLE ACQUISITIONS WITH GLOBAL INVERSION CYCLING FOR VASCULAR-SPACE-OCCUPANCY DEPENDANT AND APPARATUSES AND DEVICES RELATED THERETO

(75) Inventors: Xavier Golay, Singapore (SG); Hanzhang Lu, Baltimore, NY (US); Peter C. M. van Zijl, Ellicott City, MD (US)

(73) Assignee: The Johns Hopkins University, Baltimore, MD (US)

(*) Notice: Subject to any disclaimer, the term of this patent is extended or adjusted under 35 U.S.C. 154(b) by 207 days.

(21) Appl. No.: 10/729,360

(22) Filed: Dec. 4, 2003

(65) Prior Publication Data

US 2005/0030024 A1 Feb. 10, 2005

Related U.S. Application Data

(60) Provisional application No. 60/430,739, filed on Dec. 4, 2002.

(51) Int. Cl.
*G01V 3/00* (2006.01)

(52) U.S. Cl. .................................. 324/309; 324/307
(58) Field of Classification Search ................ 324/309, 324/307, 300, 318, 319, 322; 128/653
See application file for complete search history.

(56) References Cited

U.S. PATENT DOCUMENTS

| | | | | |
|---|---|---|---|---|
| 4,689,563 A | | 8/1987 | Bottomley et al. | 309/324 |
| 4,745,364 A | * | 5/1988 | Hatanaka | 324/309 |
| 4,968,937 A | | 11/1990 | Akgun | 309/324 |
| 5,429,134 A | | 7/1995 | Foo | |
| 5,990,681 A | | 11/1999 | Richard et al. | 309/324 |
| 6,252,399 B1 | * | 6/2001 | Pruessmann et al. | 324/307 |

OTHER PUBLICATIONS

Alsop, et al., "Background Suppressed 3D RARE Arterial Spin Labeled Perfusion MRI", Departments of Radiology and Neurology, University of Pennsylvania, Philadelphia, PA.

Lu, et al., "Functional Magnetic Resonance Imaging Based on Changes in Vascular Space Occupancy", Magnetic Resonance in Medicine 50:263–274 (2003), pp. 263–274.

Duyn, et al., "High–Sensitivity Single–Shot Perfusion–Weighted fMRI", Magnetic Resonance in Medicine 46:88–94 (2001), pp. 88–94.

(Continued)

*Primary Examiner*—Brij B. Shrivastav
(74) *Attorney, Agent, or Firm*—Peter F. Corless; William J. Daley, Jr.; Edwards & Angell, LLP

(57) ABSTRACT

Featured are methods for magnetic resonance imaging in which MR signals of selected tissues, fluid or body components in a target area are desired to be essentially eliminated, which method includes applying an initial RF inversion pulse to invert the magnetization of the selected tissues or to apply any other T1 preparation aimed at nulling one or more tissue species and successively applying one or more RF inversions pulses thereafter. More particularly, the successively applied RF inversion pulses are applied so as to essentially maintain the magnetization of the selected tissues at or about the zero-crossing point of the longitudinal magnetization. Such methods further include interleaving a plurality of excitation pulses for acquiring image data and the RF inversion pulses so that at least one of the plurality of excitation pulses follows in a time sequence the application of one of the applied RF inversion pulses such that the image data is acquired following an inversion pulse.

20 Claims, 12 Drawing Sheets

(5 of 12 Drawing Sheet(s) Filed in Color)

OTHER PUBLICATIONS

Song, et al., "Multislice Double Inversion Pulse Sequence for Efficient Black–Blood MRI", Magnetic Resonance in Medicine 47:616–620 (2002), pp. 616–620.

Ye, et al., "Noise Reduction in 3D Perfusion Imaging by Attenuating the Static Signal in Arterial Spin Tagging (ASSIST)", Magnetic Resonance in Medicine 44:92–100 (2000), pp. 92–100.

Blamire, et al., "Spin Echo Entrapped Perfusion Image (SEEPAGE). A Nonsubtraction Method for Direct Imaging of Perfusion", Magnetic Resonance in Medicine 43:701–704 (2000), pp. 701–704.

* cited by examiner

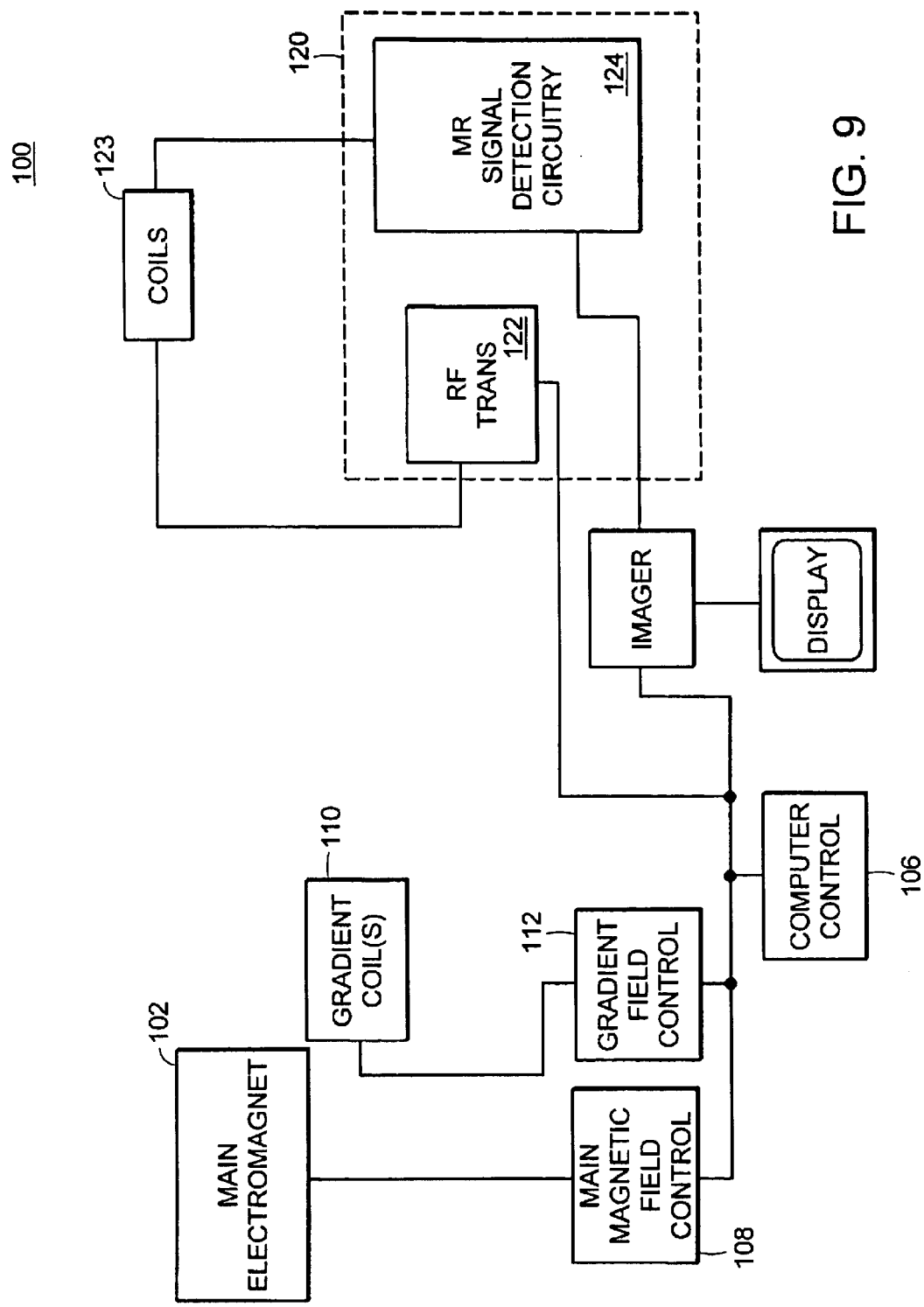

METHODS FOR MULTIPLE ACQUISITIONS WITH GLOBAL INVERSION CYCLING FOR VASCULAR-SPACE-OCCUPANCY DEPENDANT AND APPARATUSES AND DEVICES RELATED THERETO

This application claims the benefit of U.S. Provisional Application Ser. No. 60/430,739 filed Dec. 4, 2002, the teachings of which are incorporated herein by reference in their entirety

STATEMENT REGARDING FEDERALLY-SPONSORED RESEARCH

The present invention was supported by grants from the National Institute of Health (NCRR), grant number RR15241 and the National Institute of Health (NINDS), grant number NS37664. The U.S. Government may have certain rights to the present invention.

FIELD OF INVENTION

The present invention generally relates to methods, apparatuses and systems for magnetic resonance (MR) imaging (MRI), also known as nuclear magnetic resonance (NMR) imaging (NMRI). More particularly the present invention relates to methods and systems to for magnetic resonance imaging including application of pulses for essentially nulling one or more particular species, tissues or and acquisition of MR image data in one or more slices while keeping the signal from the one or more species, tissues or the essentially nulled.

BACKGROUND OF THE INVENTION

Magnetic resonance imaging (MRI) is a technique that is capable of providing three-dimensional imaging of an object. A conventional MRI system typically includes a main or primary magnet that provides the main static magnetic field $B_o$, magnetic field gradient coils and radio frequency (RF) coils, which are used for spatial encoding, exciting and detecting the nuclei for imaging. Typically, the main magnet is designed to provide a homogeneous magnetic field in an internal region within the main magnet, for example, in the air space of a large central bore of a solenoid or in the air gap between the magnetic pole plates of a C-type magnet. The patient or object to be imaged is positioned in the homogeneous field region located in such air space. The gradient field and the RF coils are typically located external to the patient or object to be imaged and inside the geometry of the main or primary magnet(s) surrounding the air space. There is shown in U.S. Pat. Nos. 4,689,563; 4,968,937 and 5,990,681, the teachings of which are incorporated herein by reference, some exemplary MRI systems.

In MRI, high-resolution information is obtained on liquids such as intracellular or extra-cellular fluid, tumors such as benign or malignant tumors, inflammatory tissues such as muscles and the like through the medium of a nuclear magnetic resonance (NMR) signal of a nuclear magnetic resonance substance such hydrogen, fluorine, magnesium, phosphorous, sodium, calcium or the like found in the area (e.g., organ, muscle, etc.) of interest. In addition to being a non-invasive technique, the MRI images contain chemical information in addition to the morphological information, which can provide physiological information.

Most clinical uses of MRI of biological tissue, however, employ the water content and water relaxation properties to image anatomy and function with micro-liter resolution. The relaxation properties of water (through $^1H$ nuclei) are the basis for most of the contrast obtained by NMR imaging techniques. Conventional $^1H$ NMR images of biological tissues usually reflect a combination of spin-lattice (T1) and spin-spin (T2) water $^1H$ relaxation. The variations in water $^1H$ relaxation rate generate image contrast between different tissue and pathologies depending upon how the NMR image is collected.

With MRI based on $^1H$ water relaxation properties, the system typically detects signals from mobile protons ($^1H$) that have sufficiently long T2 relaxation times so that spatial encoding gradients can be played out between excitation and acquisition before the signal has completely decayed. The T2-values of less mobile protons associated with immobile macromolecules and membranes in biological tissues are too short (e.g., less than 1 ms) to be detected directly in the MRI process.

In MRI, one of the most common problems or issues to solve relates to the selective imaging of a particular tissue type (i.e., T1 species) or body component or the like of interest, without contamination or too much influence from other tissue types or body components of a specific location of the body. There are several possible techniques for MR imaging to eliminate unwanted tissue or body components. One is using the difference in spatial location, such as in outer volume fat suppression in MR spectroscopic imaging. Another is using the difference in resonance frequency, mostly used for elimination of any residual fat signal in most MR imaging or spectroscopic techniques.

The technique that is least sensitive to local variations in magnetic field or moving spins (such as in blood or CSF) is to use the difference in longitudinal relaxation time (T1) between different tissues types. This longitudinal relaxation time (T1) is an inherent property of any body component and is different for any organ and it represents the time constant by which the magnetization exponentially return to its original equilibrium value after application of an RF excitation pulse. Below are three different examples of magnetic resonance sequences utilizing such nulling preparation schemes of a moving fluid.

First, a functional MRI (fMRI) technique was recently developed/introduced that can be used to sense cerebral blood volume (CBV) changes during neural activity referred to as Vascular-Space-Occupancy (VASO) that uses a non-selective inversion pulse with an optimal inversion time (TI) to eliminate blood signals. More precisely, an inversion-recovery sequence is used whereby an inversion pulse or sequence of pulses (resulting in a 180 deg. pulse) inverts the magnetization non-selectively in the entire brain, and an optimal time is provided in order for the blood magnetization to recover and cross the zero line. All other tissue parts present in the brain (CSF, gray matter, white matter) will have some remaining magnetization due to the difference in their T1 relaxation time with the T1 relaxation time of the blood. In VASO, the remaining tissue signal is thus determined by the amount of extravascular water protons in a voxel, and is therefore directly related to CBV. There is shown in FIGS. 1A–1C the time course of the inversion-recovery sequence and signals from blood and tissue after an inversion pulse, which illustrate that the longitudinal magnetization relaxes back towards equilibrium after application of this pulse. In the particular application of the technique, a non-selective inversion pulse, i.e. without slice-selection gradient, is used to invert the magnetization so as to minimize or avoid signal dependence on flow effects.

The above-described inversion-recovery sequence technique, however, is limited in that as a practical matter the approach is limited to a single slice or multi-shot 3-D acquisition techniques with limited readout time due to the fact that there is only one zero-crossing point on the T1 relaxation curve as is illustrated in FIG. 1B. Thus, for application of VASO in fMRI, which requires the repeated fast acquisitions (using single-shot techniques) of a portion of the brain (or the entire brain), there are no sequences existing to make it useable in more than a single-slice.

The second example concerns black-blood angiography imaging, and is related to VASO by the fact that the blood needs to be nulled. However, an additional effect can be used in this case that makes it relatively easier to use is the outflow effect. Effectively, the blood needs to be nulled in the vessels only, while maximizing the surrounding tissue signal. For this reason, double-inversion pulses are usually used as preparation schemes for this sequence, in which the first one is non-selective, and the second is slice-selective, in the slice of interest. The magnetization of the inflowing blood will then again relax back, and cross zero at the time of acquisition of this particular slice, while the tissue signal will remain maximal during the whole process, having experienced two 180° pulses resulting in a net 0° pulse. The problem is more complex in multi-slice black-blood imaging, for which very complicated schemes of interleaved inversion pluses have been proposed for only limited volume coverage. These schemes have been used in combination with long echo times to make use of the "outflow" effect, using such sequences as fast spin echo. The problem is then that the available signal in the slice decays with the transverse relaxation time (T2), which is one order of magnitude lower than the longitudinal relaxation times (T1).

Another example relates to the use of preparation sequences in brain perfusion imaging to eliminate the signal from the tissues (gray matter, white matter, CSF), while maximizing the signal from the blood perfusing these tissues. The situation is then the inverse from the two previous example, in which the blood signal was nulled. In order to null the signal of more than one tissue species, more than one inversion pulse is needed. Generally, for N tissues to null, we need N inversion pulses. Several methods using similar principles have been published. Then again, the use of these methods for fMRI or for any application in which rapid imaging is required is restrained by the single time point on the multiple inversion curves of all these tissues at which they cross the zero line. So far, either multi-shot approaches have been proposed, or deviations from the pure zero-crossing point have been used.

Furthermore, in a large number of MR clinical imaging sequences besides the three examples above, it is desired to suppress the large signal coming from lipids, which can produce artifacts, especially in fast sequences, such as spiral or echo-planar imaging. In these other techniques, suppression of the signals from fat uses generally spectrally selective saturation or inversion pulses on the fat signal, or spectral-selective water excitation. The weakness of such methods, however, is that they rely on a very good homogeneity of the main magnetic field Bo, which can be hard to achieve at high fields or in the part of the body placed away from the isocenter of the magnet (e.g., breast imaging), or in areas with strong susceptibility differences (e.g., in cartilage imaging).

It thus would be desirable to provide new MR imaging methods that allow the acquisition of MR images in multiple slices while keeping the signal from the one or more species around the zero-crossing point (i.e., nulled) using non-selective inversion pulses that are aimed towards the continuous nulling of one or more T1 species during the acquisition of multiple slices or sections of a three-dimensional dataset. More particularly, such methods would include interleaving one or more excitation pulses for acquiring MRI image data with non-selective inversion pulses. It would be particularly desirable to provide such methods that would allow acquisition of MR images of successively acquired slices without essentially any contamination by the targeted nulled species. It would be particularly desirable to provide such methods in which the plurality or more of successively acquired slices or sections of a three dimensional dataset are acquired between two sets of one or more signals or pluses being generated to null the one or more species. It also would be desirable to provide systems, devices and apparatuses embodying such methods.

SUMMARY OF THE INVENTION

The present invention features a method for magnetic resonance imaging in which MR signals of selected tissues, fluid or body components in a target area of an object to be imaged are desired to be essentially eliminated. According to one aspect of the present invention, such a method includes applying an initial RF inversion pulse to invert the magnetization of the selected tissues, fluid or body component; and thereafter successively applying one or more RF inversions pulses thereto. In particular aspects, the successively applied RF inversion pulses are applied in a time sequence so as to essentially maintain the magnetization of the selected tissues, fluid or body component at or about the zero-crossing point of the longitudinal magnetization. As indicated herein, the inversion pulse also can comprise a sequence of pulses that result in an inversion pulse (resulting in a 180 deg. pulse).

Such a method further includes applying a plurality of excitation pulses for acquisition of MR image data; and interleaving the application of the plurality of excitation pulses and the application of the RF inversion pulses so that at least one of the plurality of excitation pulses follows in a time sequence the application of one of the applied RF inversion pulses. Such a method also includes acquiring MR image data; and sequencing the acquisition of MR image data so that the image data is being acquired following in a time sequence the application of one of the applied RF inversion pulses.

In particular embodiments, the acquiring of MR image data includes acquiring one of a plurality of slices or sections from a 3-dimensional MR image dataset following in a time sequence the application of one of the applied RF inversion pulses. Also, the acquiring of image data is performed such that one of the plurality of slices or sections from the 3-D image data acquisitions occurs at a time preceding the zero-crossing point for longitudinal magnetization of one of the applied inversion pulses and so each of the other of the plurality of slices and 3-D image data acquisitions occurs at or following the zero-crossing point for longitudinal magnetization of said one of the applied inversion pulses, depending on the tolerance to small variation around zero of the specific selected tissues, fluid or body component to be nulled.

According to another aspect of the present invention such a method includes applying an initial RF inversion pulse to invert the magnetization of the selected tissues, fluid or body component; and successively applying a plurality or more of RF inversions pulses thereto. As indicated herein each inversion pulse can comprise a sequence of pulses arranged so the inversion pulse results there from. In particular aspects, the successively applied plurality of RF inversion pulses are applied in a time sequence so as to essentially maintain the magnetization of the selected tissues, fluid or body component at or about the zero-crossing point of the longitudinal magnetization as initially established by the application of the initially applied inversion pulse.

Such a method further includes applying a plurality of excitation pulses for acquisition of MR image data; and interleaving the application of the plurality excitation pulses and the application of the initial RF inversion pulse and the plurality of successively applied RF inversion pulses so that each of the plurality of excitation pulses follows in a time sequence the application of either of the initial RF inversion pulse or the plurality of successively applied RF inversion pulses. Such a method also includes acquiring MR image data; and sequencing the acquisition of MR image data so that such image data is acquired following in a time sequence the application of either of the initial RF inversion pulse or the plurality of successively applied RF inversion pulses.

In particular embodiments, such acquiring of image data includes acquiring one of a plurality of slices or multiple sections of 3-dimensional MR image data following in a time sequence the application of either of the initial RF inversion pulse or the plurality of successively applied RF inversion pulses. Also, the acquiring of image data is performed such that one of the plurality of slices or 3-D image data acquisitions occurs at a time preceding the zero-crossing point for longitudinal magnetization of either of the initial RF inversion pulse or the plurality of successively applied RF inversion pulses and so each of the other of the plurality of slices and 3-D image data acquisitions occurs at or following said zero-crossing point for the longitudinal magnetization, depending on the tolerance to small variation around zero of the specific selected tissues, fluid or body component to be nulled.

According to another aspect of the present invention there is featured a method for magnetic resonance imaging in which MR signals of selected tissues, fluid or body components in a target area of an object to be imaged are desired to be essentially eliminated. Such a method includes applying an initial RF inversion pulse of a T1 preparatory sequence of one of an inversion-recovery technique, a saturation recovery technique or a multiple-inversion-recovery technique and successively applying one or more RF inversions pulses of the T1 preparatory sequence or any other T1-based preparatory scheme. In particular aspects, the successively applied RF inversion pulses are applied in a time sequence so as to essentially maintain the magnetization of the selected tissues, fluid or body component at or about the zero-crossing point of the longitudinal magnetization. As indicated herein each inversion pulse can comprise a sequence of pulses arranged so the inversion pulse results there from.

Such a method further includes interleaving the inversion pulses of the initial RF inversion pulse and the one or more successively applied inversion pulses with excitation pulses associated with MR imaging process so as to allow acquisition of MR image data at or about a condition where signals from the selected tissues, fluid or body components are minimized and so as to essentially not contaminate other MR signals being acquired from the target area. Such a method also includes interleaving the inversion pulses of the initial RF inversion pulse and the one or more successively applied inversion pulses with excitation pulses associated with MR imaging process so as to allow acquisition of MR image data at or about a condition where signals from the selected tissues, fluid or body components are being maintained essentially nulled. The inversion-recovery technique includes but is not limited to one of FLAIR, STIR, bright blood coronary angiography or VASO and the multiple-inversion recovery technique includes black-blood angiography, the background suppression techniques associated with such perfusion techniques such as ASSIST, SEEPAGE, SSPL or the equivalent.

In particular embodiments, the interleaving includes interleaving the inversion pulses and the excitation pulses so as to acquire one of a plurality of slices or 3-dimensional MR image data following in a time sequence the application of one of the applied RF inversion or saturation pulses. Also, the interleaving can be performed such that one of the plurality of slices or 3-D image data acquisitions occurs at a time preceding the zero-crossing point for longitudinal magnetization of one of the applied inversion pulses and so each of the other of the plurality of slices and 3-D image data acquisitions occurs at or following the zero-crossing point for longitudinal magnetization of said one of the applied inversion pulse, depending on the tolerance to small variation around zero of the specific selected tissues, fluid or body component to be nulled.

According to another aspect of the present invention such a method includes applying an initial RF inversion pulse to invert the magnetization of the selected tissues, fluid or body component; and successively applying one or more, more particularly, a plurality or more, of RF inversions pulse sets thereafter. Each of the RF inversion sets comprises at least one RF inversion pulse and at least one of the inversion pulse sets includes a plurality of successively applied RF inversion pulses. As indicated herein each inversion pulse can comprise a sequence of pulses arranged so a composite inversion pulse results there from. In particular aspects, the successively applied plurality of RF inversion pulses are applied in a time sequence so as to essentially maintain the magnetization of the selected tissues, fluid or body component at or about the zero-crossing point of the longitudinal magnetization as initially established by the application of the initially applied inversion pulse or any other T1-based preparation sequence, such as saturation-recovery, or multiple-inversion-recovery or a combination thereof.

Such a method further includes applying a plurality of excitation pulses for acquisition of MR image data; and interleaving the application of the plurality of excitation pulses and the application of the initial RF inversion pulse and the plurality of successively applied RF inversion pulse sets so that each of the plurality of excitation pulses follows in a time sequence the application of either of the initial RF inversion pulse or the plurality of successively applied RF inversion pulse sets. Such a method also includes acquiring MR image data; and sequencing the acquisition of MR image data so image data is acquired following in a time sequence the application of either of the initial RF inversion pulse or the plurality of successively applied RF inversion pulse sets.

In particular embodiments, such acquiring of image data includes acquiring one of a plurality of slices or multiple sections of 3-dimensional MR image data following in a time sequence the application of either of the initial RF inversion pulse or the plurality of successively applied RF inversion pulse sets. Also, the acquiring of image data is performed such that one of the plurality of slices or 3-D image data acquisitions occurs at a time preceding the zero-crossing point for longitudinal magnetization of either of the initial RF inversion pulse or the plurality of successively applied RF inversion pulse sets and so each of the other of the plurality of slices and 3-D image data acquisitions occurs at or following said zero-crossing point for the longitudinal magnetization, depending on the tolerance to small variation around zero of the specific selected tissues, fluid or body component to be nulled.

Also features are systems, apparatuses and devices related thereto and embodying such methods. In particular embodiments, there is featured a MRI/NMRI system including a controller that controls functionalities of the system including gradient coils, apparatuses or devices for generating RF pulses and the signal receiving portions thereof. Such a controller is configured and arranged so as to embody the methodology of the present invention including the sequencing of the one or more inversion pulses following the initially applied inversion pulse and the interleaving or sequencing of excitation pulse and MR data acquisitions so as to occur at the timings of the present invention.

Other aspects and embodiments of the invention are discussed below.

BRIEF DESCRIPTION OF THE DRAWING

For a fuller understanding of the nature and desired objects of the present invention, reference is made to the following detailed description taken in conjunction with the accompanying drawing figures wherein like reference character denote corresponding parts throughout the several views and wherein:

The patent or application file contains at least one drawing executed in color. Copies of this patent application publication with color drawing(s) will be provided by the office upon request and payment of the necessary fee.

FIG. 1A illustrates the MR pulse sequence, FIG. 1B generally illustrates the variation of longitudinal magnetization (normalized) as a function of time, and FIG. 1C generally illustrates the variation of transverse longitudinal magnetization (normalized) as a function of time.

FIG. 2A illustrates the pulse sequence for such a technique and FIG. 2B illustrates the longitudinal magnetization as a function of time of blood (solid curve) and tissue (dashed curve). Following an optimal delay time (TI), the first brain slice is excited and EPI data are acquired. T1 is chosen to eliminate blood signal at the time of acquisition. After the first slice is acquired, the blood magnetization crosses the zero point and becomes positive. A 180° pulse is used to again invert the longitudinal magnetization. After a small interval (TS/2), the blood signal becomes zero again and a second slice can be acquired (black dot). The tissue signal is negative at this time but this can be corrected by forming the modulus image. This interleaving of excitation and inversion pulses is repeated multiple times to acquire the required number of slices. To avoid any stimulated echo formation, gradient crusher cycling is applied for different slices. TR=6000 ms, TI=936 ms, TS=70 ms.

FIG. 3A illustrates the pulse sequence for such a technique and FIG. 3B illustrates the corresponding magnetization profiles. In the illustrated embodiment, three (3) slices are acquired within each 180°-180° interval to increase the efficiency of data acquisition and thus minimize the signal decay. A further advantage of this embodiment is the reduction of applied RF pulses, and therefore deposited energy in the human body. Residual blood signal throughout the multi-slice acquisition can be maintained at a negligible level (<3%, solid curve). TR=6000 ms, TS=25 ms, TI=898 ms. Note that TS is significantly shorter than that shown in FIG. 2.

FIG. 9 is a block diagram of an illustrative magnetic resonance imaging system embodying the methodology of the present invention.

DESCRIPTION OF THE PREFERRED EMBODIMENT

The present invention features a method for MR imaging particularly MR imaging in which RF inversion pulses are applied to a target area for essentially nulling one or more particular species, tissues or body components of the object to be imaged such as a mammalian body and acquisition of MR image data in one or more slices while keeping the signal from the one or more species, tissues or the like essentially nulled. The image data being acquired also can be 3-dimensional (3-D) image data. In its broadest aspects, and also with reference to the pulse sequence illustrated in FIG. 2A, the methodology of the present invention applies an initial preparation sequence (i.e., inversion pulse, a plurality or more of inversion pulses, a saturation pulse or other T1-prepration scheme) to the target area to null the magnetization of the selected tissues and at a time thereafter, preferably corresponding to the time that is optimal for the elimination of signals from the selected tissues using inversion pulses and the like, a first slice is excited and image data there from is acquired using any of a number of techniques or devices known to those skilled in the art.

At the end of the first acquisition of image data or signals, another inversion pulse is applied to re-invert the longitudinal magnetization. Following at another time after applying this another inversion pulse interval, another slice or image data is acquired and the process is repeated as many times as is required to acquire the desired image of the volume being targeted.

Figure 3A:
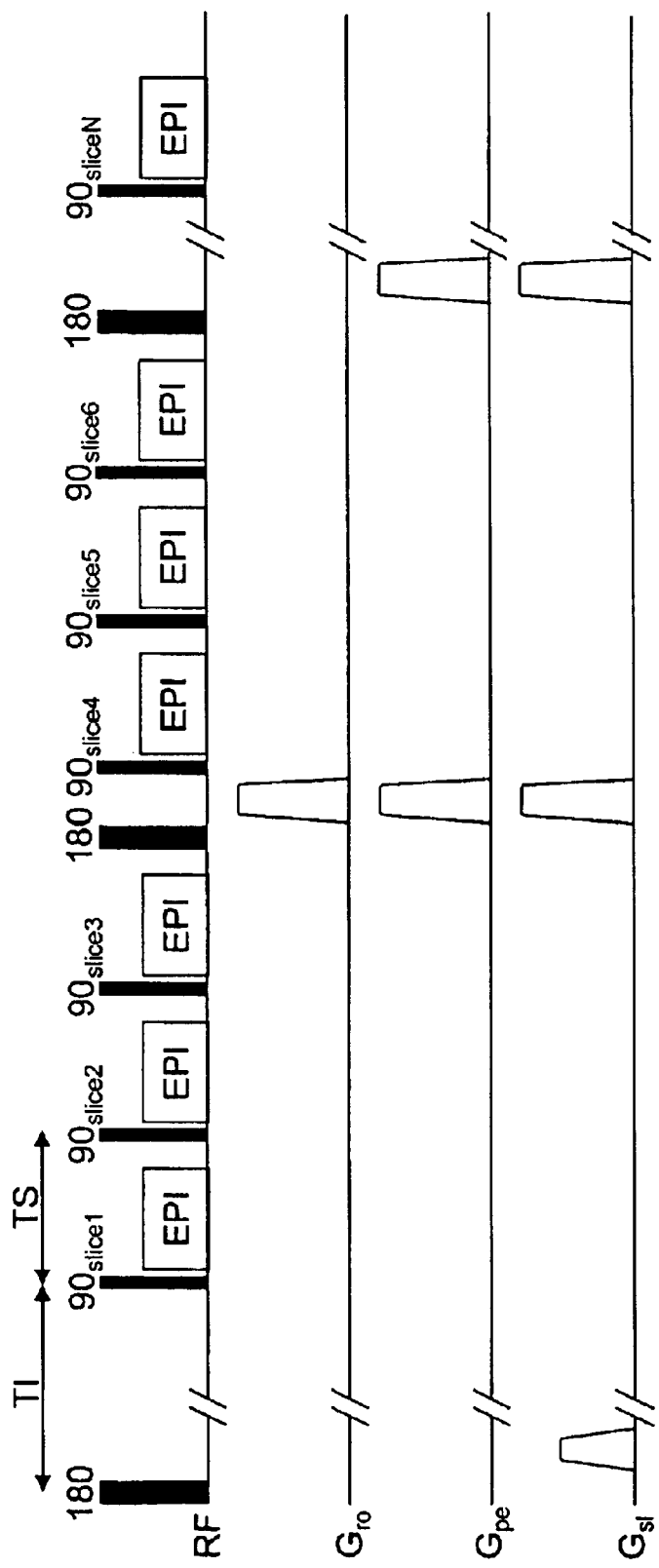
FIGS. 3A–B are graphs illustrating another embodiment of the MAGIC VASO technique; where
Figure 8A:
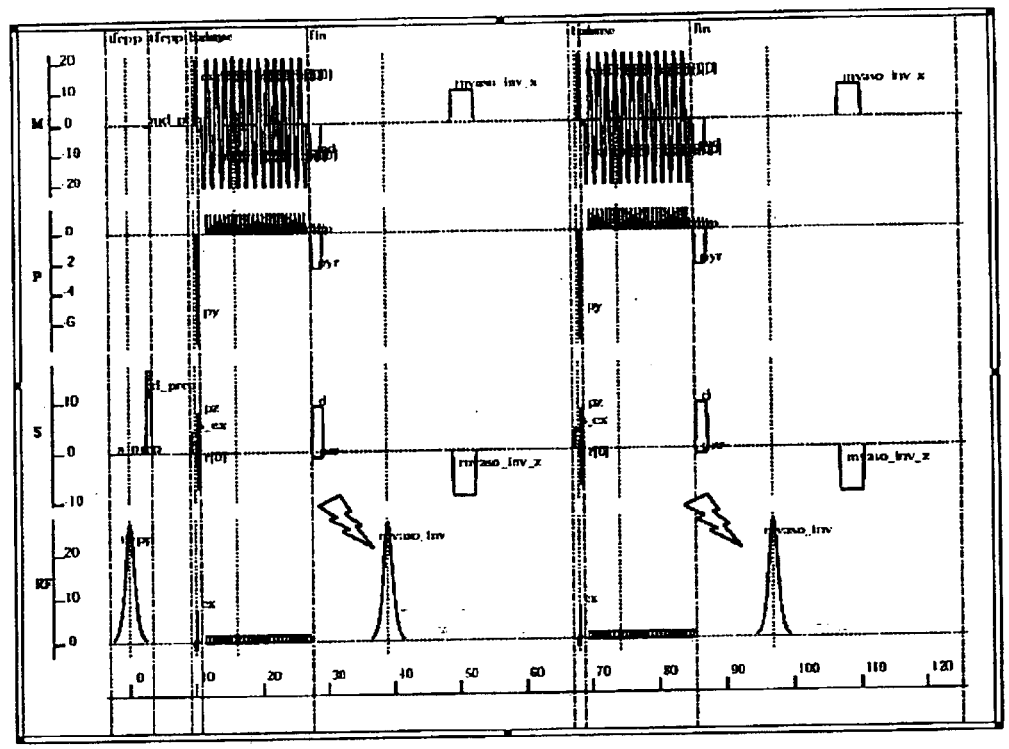
FIG. 8A is a schematic representation of #-D MAGIC VASO pulse sequence. Note the 180 deg. inversion pulses
Figure 8B:
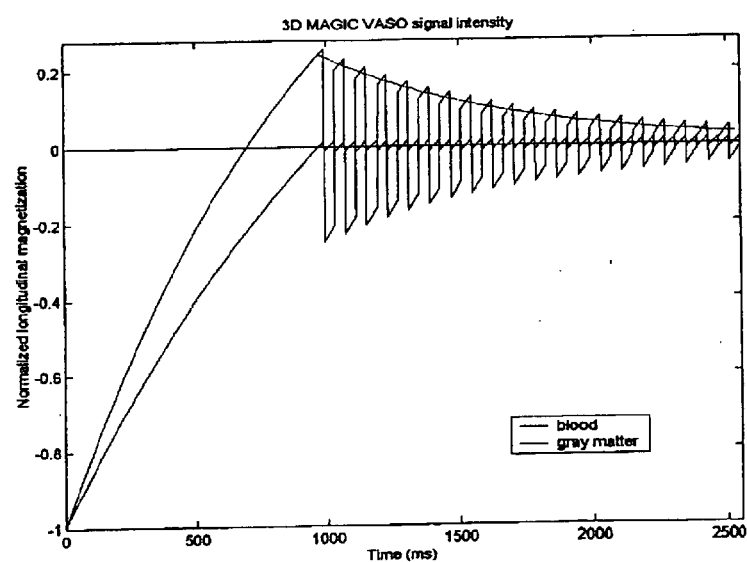
FIG. 8B is a graphical simulation illustrative of signal behavior (e.g., signal time course) for 3-D MAGIC-VASO technique.

In another aspect of the present invention, and with reference to the pulse sequence in FIG. 3A and FIGS. 8A–B, the methodology of the present invention applies an initial preparation sequence (i.e., inversion pulse, a plurality or more of inversion pulses, a saturation pulse or other T1-prepration scheme) to the target area to null the magnetization of the selected tissues and at a time thereafter, preferably corresponding to the time that is optimal for the elimination of signals from the selected tissues using inversion pulses and the like. Thereafter, a plurality or more of excitation pulses are generated and MR image data comprising one of a plurality of slices or sections from a 3-dimensional MR image dataset are acquired using any of a number of techniques or devices known to those skilled in the art. In an illustrative embodiment, three slices of image data are acquired after each of the inversion pulses.

At the end of the first acquisition of image data or signals, another inversion pulse is applied to re-invert the longitudinal magnetization. Following at another time after applying this another inversion pulse interval, a plurality or more of excitation pulses are again generated and MR image data comprising one of a plurality of slices or sections from a 3-dimensional MR image dataset are acquired. This process is repeated as and as many times as is required to acquire the desired image of the volume being targeted. In more particular embodiments, the acquisition of MR image data is undertaken or performed such that one of the plurality of slices or sections from the 3-D image data acquisitions occurs at a time preceding the zero-crossing point for longitudinal magnetization of one of the applied inversion pulses (i.e., the initially applied inversion pulse or one of the successively applied inversion pulses) and so each of the other of the plurality of slices and 3-D image data acquisitions occurs at or following the zero-crossing point for longitudinal magnetization of said one of the applied inversion pulses, depending on the tolerance to small variation around zero of the specific selected tissues, fluid or body component to be nulled.

In yet another aspect of the present invention, the methodology of the present invention applies an initial preparation sequence (i.e., inversion pulse, a plurality or more of inversion pulses, a saturation pulse or other T1-prepration scheme) to the target area to null the magnetization of the selected tissues and at a time thereafter, preferably corresponding to the time that is optimal for the elimination of signals from the selected tissues using inversion pulses and the like, and thereafter one or more excitation pulses are generated and MR image data is acquired such as that described hereinabove. At the end of the first acquisition of image data or signals, an inversion pulse set, comprising a train or sequence of one or more, more specifically a plurality or more of inversion pulses, is applied where each of the one or plurality or more of inversion pulses re-inverts the longitudinal magnetization. Following at another time after applying this inversion pulse set one or more excitation pulses are generated and MR image data is acquired such as that described hereinabove. This process is repeated as and as many times as is required to acquire the desired image of the volume being targeted.

It is within the scope of the present invention for the inversion pulse sets to be constituted so that each inversion pulse set is made up of the same number of inversion pulses or so as to be constituted so that some pulse sets are made up of one number of inversion pulses (e.g., a single inversion pulse) and other of the pulse sets are made up of a different number of inversion pulses (e.g., a plurality of inversion pulses). In more specific embodiments, when the inversion pulse sets are made up of an even number of inversion pulses (e.g., two inversion pulses or multiple thereof), the remaining magnetization of the desired component to be imaged is advantageously kept of a same sign throughout the multiple readouts of the experiments.

The methodology of the present invention is more particularly described in connection with the following discussion directed to its embodiment into the VASO technique hereinafter referred to as the Multiple Acquisitions with Global Inversion Cycling (MAGIC) VASO technique. The following, however, shall not be construed as limiting adaptation of the methodology of the present invention to the VASO technique as it is within the scope of the present invention to adapt any of a number of MR imaging techniques known to those skilled in the art so as to embody the methodology of the present invention as well as to adapt other species nulling type of techniques so as to be capable of easily acquiring multiple slices of MR image data, such other techniques including but not limited to an inversion-recovery technique {e.g., FLAIR (Fluid-Attenuated Inversion Recovery), STIR, bright blood coronary angiography or VASO), a saturation-recovery technique (e.g., fat suppression), a multiple-inversion recovery technique (e.g., black-blood angiography) or, background suppression techniques such as those related to arterial spin labeling-based perfusion techniques (such as ASSIST, SEEPAGE, SSPL or the equivalent).

As indicated herein a new fMRI technique that is sensitive to cerebral blood volume (CBV) changes during neuronal activity was recently introduced entitled VASO and that this VASO dependent fMRI uses a non-selective inversion pulse in combination with an optimal T1 to eliminate blood signals. Lu H, Golay X, Pekar J J, van Zijl PCM; Functional Magnetic Resonance Imaging Based On Changes In Vascular Space Occupancy; Magn Reson Med 2003; 50:263–274. The remaining tissue signal is determined by the amount of extravascular water protons in a voxel, and is therefore directly related to CBV. Upon stimulation, the VASO-fMRI signal shows a signal decrease, consistent with a blood volume increase that results in more signal nulling.

In view of the spatial specificity provided by the VASO technique, it is desirous to adapt such a technique so as to be useful to apply this method to routine human brain fMRI as well as to clinical applications of VASO to assess diseases with blood volume abnormalities in view of its non-invasive character. The MAGIC VASO technique disclosed herein provides a new multi-slice blood-nulling approach or technique that uses inversion pulses, more particularly non-selective inversion pulses, to keep the blood magnetization around the zero-point, while acquiring images between the inversion pulses.

Figure 1A:
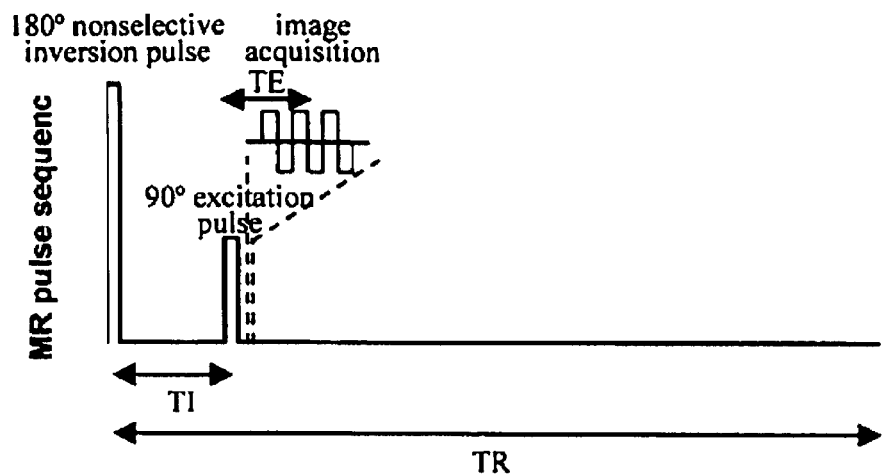
FIGS. 1A–C are various time dependent graphs illustrating the time course of inversion-recovery signals from blood and tissue after a single inversions pulse using the inversion-recovery technique embodied in VASO-fMRI, where
Figure 1B:
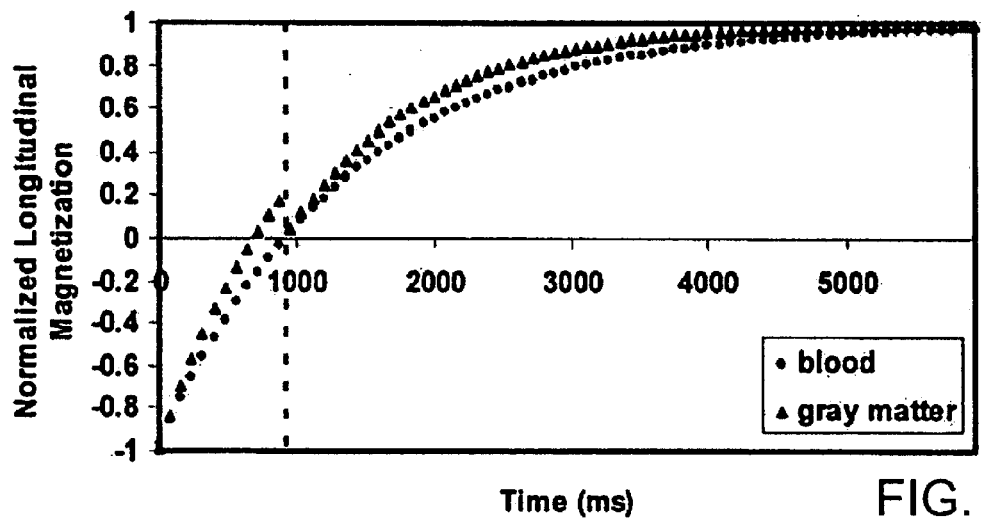
Figure 1C:
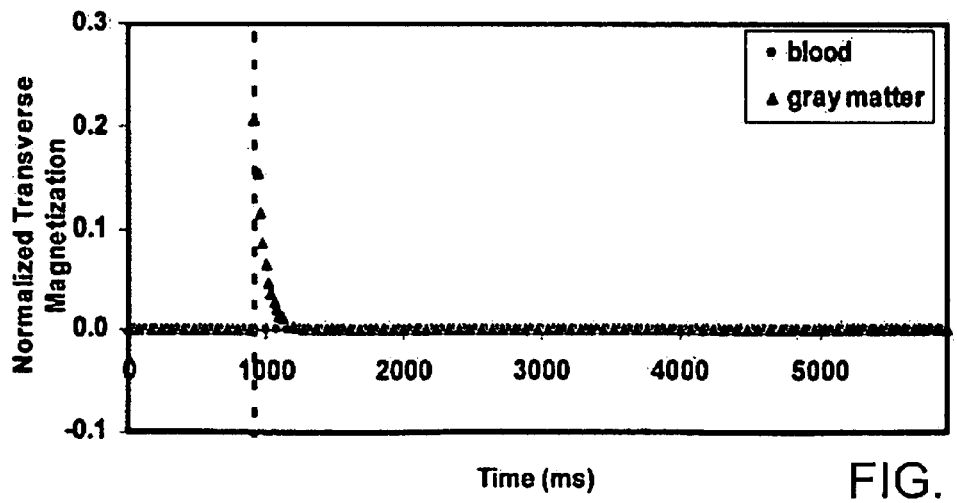
Figure 2A:
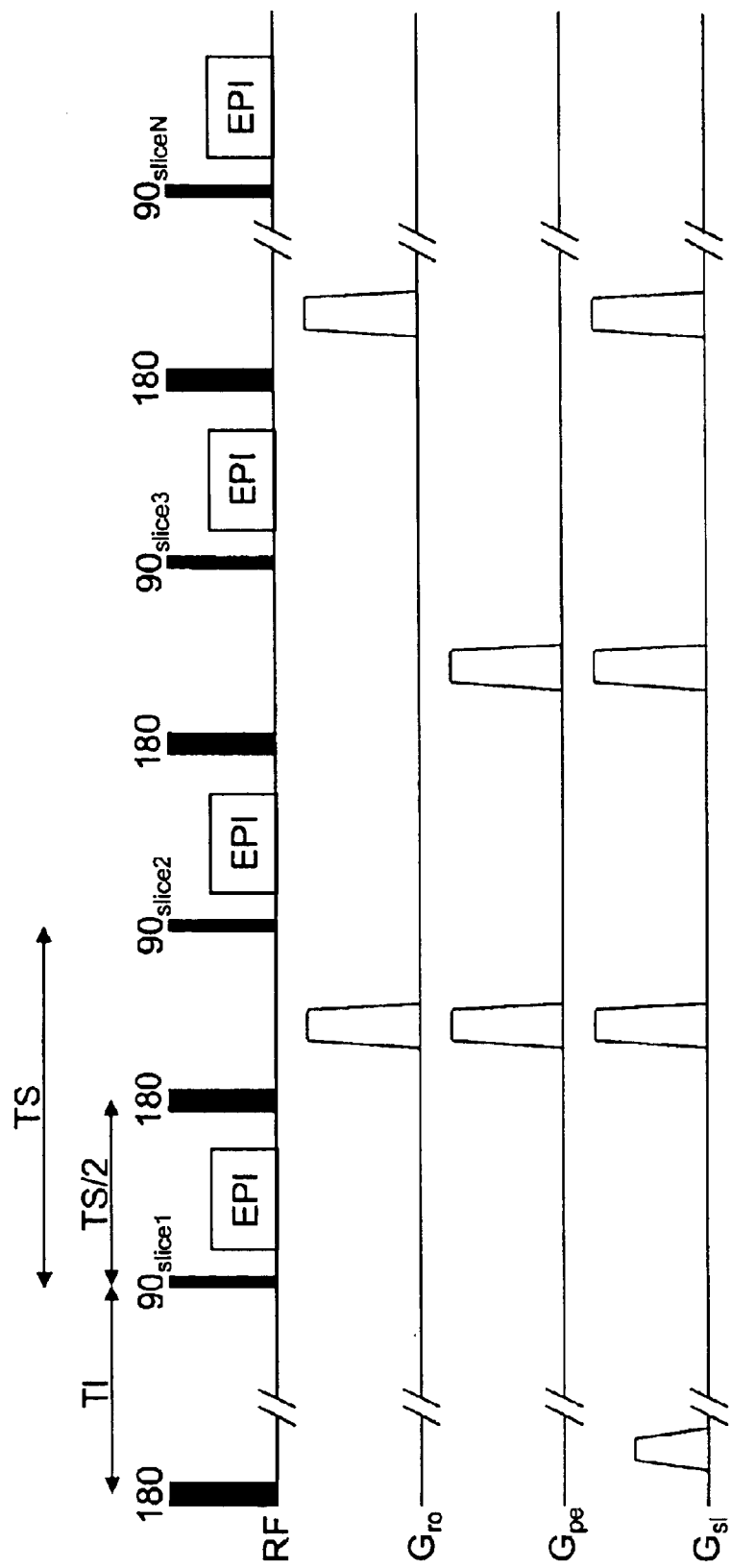
FIGS. 2A–B are graphs illustrating one embodiment of the Multiple Acquisition with Global Inversion Cycling (MAGIC) VASO technique; where

Referring now to FIG. 2A, there is shown a MAGIC-VASO pulse sequence according to one embodiment of the present invention. As shown in FIG. 2A, the pulse sequence starts with a 180° pulse (i.e., the inversion pulse) to invert the magnetization, after which the longitudinal magnetization relaxes back towards equilibrium. Preferably, the inversion pulse is a non-slice-selective pulse so as to avoid signal dependency on flow effects. At the optimal T1 for complete blood signal elimination (e.g., at or about the zero-cross point) a first slice is excited using any of a number of techniques and/or devices known in the MRI/NMRI arts and MR or NMR image or image data is acquired, for example, using single-shot echo-planar (EPD or spiral imaging.

At the end of the first acquisition, the blood magnetization should have crossed the zero point for the longitudinal magnetization and thus should be in the positive range. After the end of the first acquisition, a second non-selective 180° pulse is applied to re-invert the longitudinal magnetization. Following a small interval (e.g., TS/2 in FIG. 2A), the blood signal becomes zero again, thus allowing a second slice to be acquired under optimal T1. The foregoing process of interleaving excitation pulses for acquiring image data and inversion pulses is repeated one or more times, a plurality or more times, multiple times and in general as many times as required so as to acquire all of the image data for the volume to be imaged.

Figure 2B:
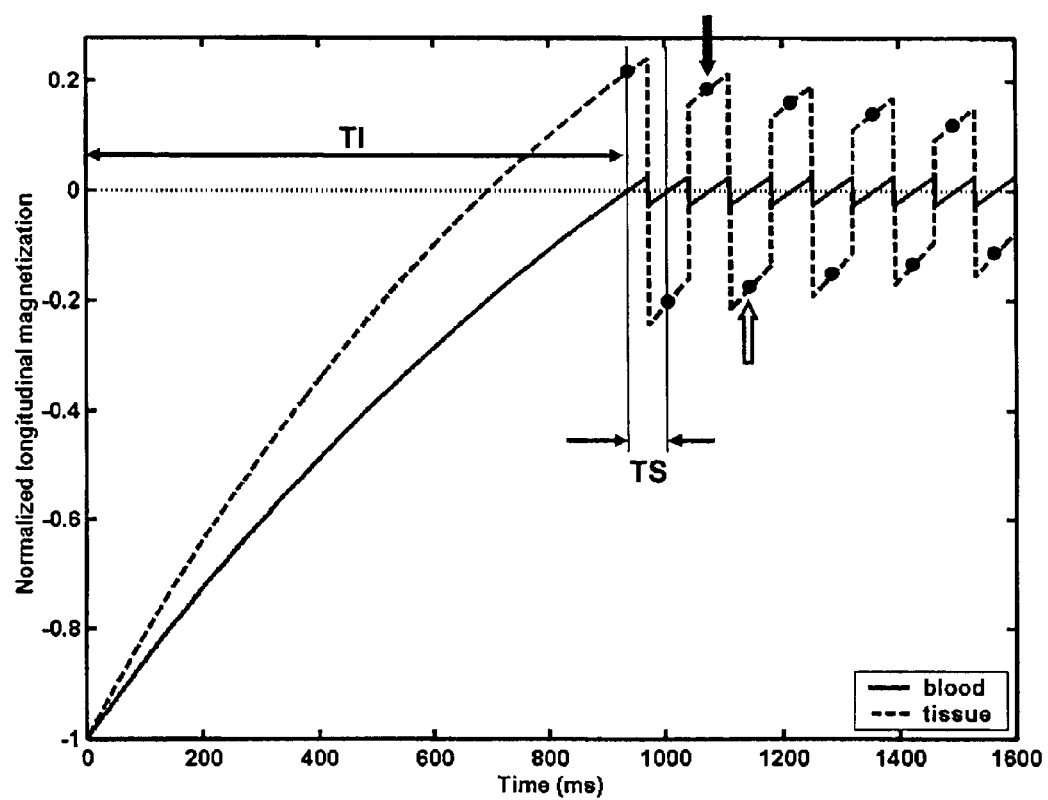

According to another embodiment of the present invention, and for purposes of minimizing the effect of inversion imperfection, the phases of the 180° pulses are alternated during following acquisition of successive slices. In addition, and for purposes of avoiding stimulated echo formation caused by non-180° character of the global inversion pulses, a multi-directional dephasing 0 gradient cycling scheme is applied. The gradient direction is cycled with increasing slice number according to the order {(Gro, Gpe, Gsl), (Gpe, Gsl), (Gro, Gsl), (Gro, Gpe), (Gsl), (Gpe), (Gro)}. In particular illustrative embodiments, gradients are first applied at a strength of 10 mT/m for 4 ms in each direction, after which the same scheme can be repeated using 3.33 mT/m, −3.33 mT/m and −10 mT/m, leading to a total of 7×4=28 potential different combinations. It should be noticed that as shown in FIG. 2A T1 (~1000 ms) is much longer than the time between slices (TS), which is about 40–80 ms depending on the echo-train length and acquisition scheme used. Numerical simulations for the longitudinal magnetization of blood (solid curve, T1=1350 ms at 1.5 T) and gray matter (dashed curve, T1=1000 ms at 1.5 T) in FIG. 2B show that blood signal can be maintained around zero throughout the acquisition of all of the slices, while the tissue signal intensities (black dots) alternate between positive and negative. In the present invention, the sign difference between adjacent slices is corrected by taking the absolute value of the resulting images.

Although the foregoing is illustrative of acquisition of slices, the methodology of the present invention is adaptable so that a 3-D imaging technique as is to those skilled in the art can be used in combination with above described MAGIC methodology of the present invention. As is known to those skilled in the art, in this application, a smaller flip angle would be used for each of the selection pulses, however, resulting in a more rapidly decaying signal in the following sections of the 3-D image data set than in multiple slices, therefore resulting in a broadening of the point-spread-function in such a case.

In further embodiments, the methodology of the present invention is adapted to minimize or avoid possible gradual signal decay as a function of slice number, which is due to the fact that the signal loss during even slice acquisitions (empty arrow) is faster than the signal recovery during odd slice acquisitions (filled arrow), as determined by the shape of the T1 relaxation curve. This signal decay is roughly exponential with a time constant of T1. TS should be as short as possible to minimize signal loss, which can be achieved by acquiring more than one slice within each 180°-180° interval. The 180°-180° interval represent the time period between the application of two non-selective inversion pulses. As indicated herein it also is within the scope of the present invention for a plurality of more of inversion pulses be applied before acquisition of the image data.

Figure 3B:
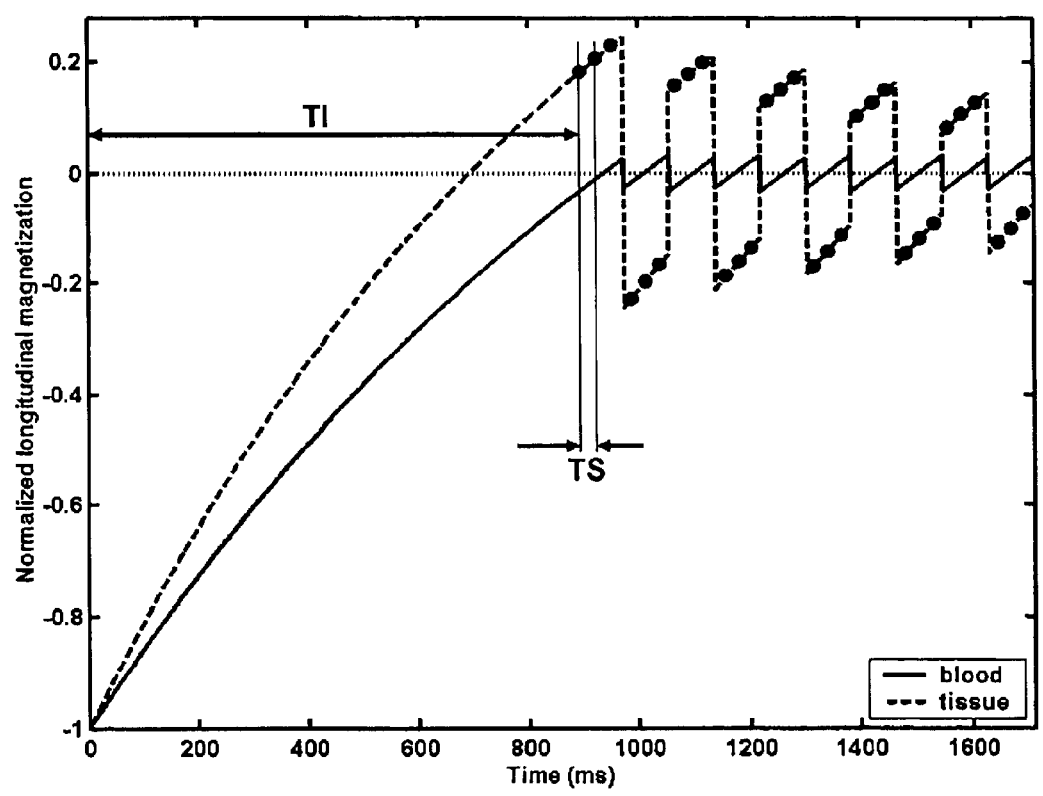

There is shown in FIG. 3A an illustrative pulse sequence, which is the one used for in vivo multi-slice VASO-fMRI experiments, for acquiring more than one slice within each 180°-180° interval. In particular, this figure illustrates acquisition of three slices of image data during each 180°-180° interval. This shall not be considered as limiting as it is within the scope of the present invention to acquire a plurality or more of such slices other wise consistent with the objectives and functions of the present invention. When acquiring three slices after each inversion pulse, the inversion interval is 82 ms. Under such an acquisition scheme, the residual blood signal is less than 3% of its equilibrium value, which corresponds to <0.7% of the tissue signal at a normal CBV of 4.7%. There is shown in FIG. 3B the longitudinal magnetization for such a protocol. Due to the MAGIC-related signal decay in the slices acquired later, the signal intensity is different in different slices, depending on the acquisition order. However, this effect is preferably corrected by performing two complementary data acquisitions: one with ascending slice acquisition order, and a second with descending slice acquisition order. The sum of these two data sets gives a new image series in which the signal intensity difference among slices is minimal.

The MAGIC pulse sequence used periodic inversion pulses to keep the blood signal nulled, thus allowing multi-slice VASO images to be acquired within a single TR. Such an extension from single-slice to multi-slice is expected to significantly increase the application potential of VASO fMRI, since multi-slice feasibility is a requirement to apply this technique to neuroscience fMRI studies. Multi-slice VASO fMRI was demonstrated using visual stimulation at 1.5 T.

Compared with BOLD-fMRI, VASO-fMRI has lower SNR and multislice acquisition is more complex. On the other hand, the VASO approach has been shown to provide better spatial localization to gray matter, whereas BOLD gradient echo and spin-echo signals are known to have significant contamination from large draining veins. Arterial spin labeling (ASL) fMRI, based on changes in cerebral blood flow, has also been shown to have higher spatial specificity than BOLD. However, multi-slice ASL is not trivial and often suffers from the effects of transit time differences among slices as well as from magnetization transfer effects due to the labeling pulses.

Figure 7:
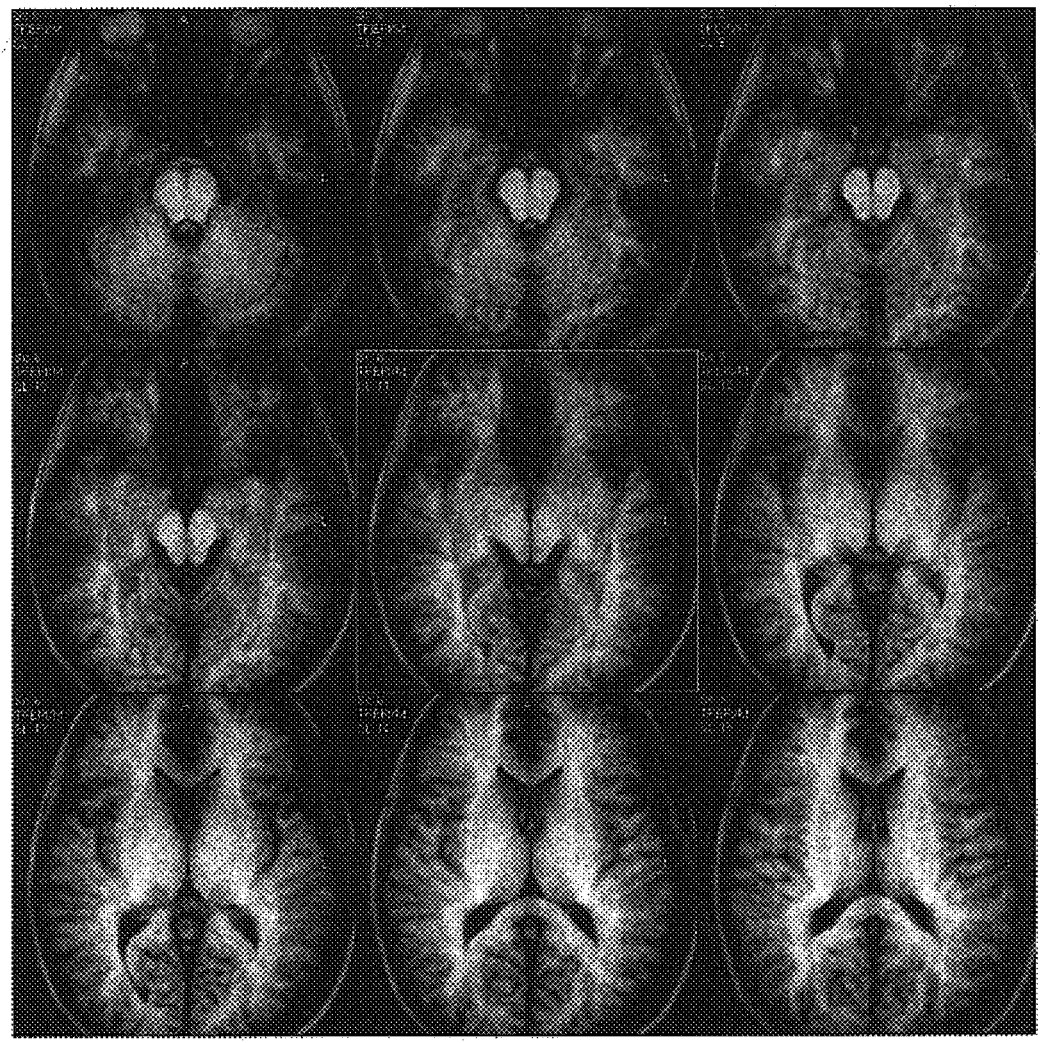
FIG. 7 is illustrative of 3-D MAGIC-VASO images.

Referring now to FIG. 7, there is shown a block diagram of an illustrative magnetic resonance imaging system 100 to illustrate the major components of such a system and the adaptation of such a system so as to embody the methodology of the present invention. Such a system includes an electromagnet 102, a computer or system controller 106, a main magnetic field control 108, a gradient coil sub-system 110, gradient magnetic field power amplifiers 112, and a RF excitation and MR signal detection apparatus 120.

The electromagnet 102 produces a strong main magnetic field Bo in which a body to be imaged, e.g. a patient, is placed on a suitable support or table (not shown). The strength of the magnetic field in the gap between the pole pieces, and hence in the body, is controlled by the computer or system controller via the main magnetic field control 108, which controls the supply of energizing current to the electromagnet energizing coil. Alternatively, for superconducting MRI electromagnets, with inherently highly-stable fields, the field is charged and set to an exact value upon installation, and not altered during normal operation.

The gradient coil sub-system 110, comprising one or more gradient coils, whereby a magnetic field gradient can be imposed on the static magnetic field in the sample volume in any one or more of three orthogonal directions X, Y, and Z. The gradient coil sub-system 110 is energized by a gradient field power amplifiers 112 that are under the control of the system controller.

The RF excitation and MR signal detection apparatus 120 includes an RF transmitter 122, MR signal detection circuitry 124, and coil(s)/antenna(s) 123 for transmitting RF pulses and receiving MR signals. The RF transmitter 122 is under the control of the system controller 106 so that RF field pulses or signals are selectively generated and applied to the body for excitation of the magnetic resonance in the body as well as the inversion pulses as described in the foregoing methodology. While these RF pulses are being applied to the body, T/R switches of the MR signal detection circuitry 124 are actuated so as to de-couple the MR signal detection circuitry from the coils.

Although a single block comprising the coil(s)/antenna(s) 123 is illustrated, it should be recognized that it is well within the skill of those knowledgeable in the art to configure the system to have any of a number of coil/antenna configurations for transmission of each of the inversion and excitation pulses and for the reception or detection of the MRI signals from the volume being imaged. Such coil/antenna configurations include, but are not limited to, a coil for both transmission and signal reception, a coil or antenna array for transmission and another coil or antenna array for signal reception, or a coil or antenna array for transmission and a plurality of coils (e.g., surface coils) or an antenna array made up of a plurality or more of detector elements (e.g., such as that described in U.S. Ser. No. 09/822,771 the teachings of which are incorporated herein by reference) for signal reception.

Following application of the RF excitation pulses, the T/R switches are again actuated to couple the coils to the MR signal detection circuitry 124. The coils detects or senses the MR signals resulting from the excited nuclei in the body and conducts the MR signals onto the MR signal detection circuitry 124. These detected MR signals are in turn passed onto an imager and the imager, under the control of the computer or system controller 106, processes the signals to produce signals representing an image of a region of interest in the body. These processed signals can be sent onto a display device to provide a visual display of the image.

Experimental Studies

Experimental studies were performed on a clinical 1.5 T MRI scanner (Philips Medical Systems, Best, The Netherlands), using the standard setup of body coil RF transmission and head coil reception. A $CuSO_4$ solution at a concentration of 1.33 mM (T1=1020 ms) was used to test the MAGIC sequence and signal intensities were compared to results from simulations. An agarose gel (1%, T1=1034 ms) phantom mixed with an identical concentration of $CuSO_4$ was used to test the effects of magnetization transfer induced by the series of inversion pulses. To maximize the signal-to-noise ratio (SNR), the initial inversion-nulling pulse was disabled. Other parameters were: TR=6000 ms, TS=70 ms, Flip angle=90°, slice number=8, matrix=64×64, field of view=240 mm.

MAGIC-VASO fMRI of visual stimulation was performed on human subjects using three slices per inversion period (see FIG. 3A). The parameters were: TR=6000 ms, TI=898 ms, TS=25 ms, TE=6 ms, Flip angle=90°, number of slices=9, matrix=64×64, FOV=240 mm, 60% half Fourier acquisition. Note that, using a blood T1 of 1350 ms at 1.5 T, the optimal TI for blood nulling is 936 ms. Because three (3) slices are acquired, however, during each 180°-180° interval, the acquisition timing is adjusted such that the first slice in each group of three is acquired slightly before nulling and the third slice is acquired slightly after nulling. Therefore, a T1 of 898 ms was used to achieve an acceptable overall nulling of the blood signal (FIG. 3B). For comparison with MAGIC-VASO fMRI, a single-slice VASO fMRI experiment was performed using the same parameters except for TI=936 ms. A high-resolution T1-weighted image and a 3D MPRAGE image (1×1×1 $mm^3$) also were acquired for anatomical reference.

All subjects (n=4, age range 26–46, 1 male, 3 females) gave informed written consent before participating in the study. The visual experiments consisted of 30 seconds of checkerboard stimulation (visual angle=25°, frequency=8 Hz) interleaved with 30 seconds of fixation, which was repeated six times. Extra resting time was used at the beginning of the experiments to allow the subjects to get used to scanner noise. The experimental duration was about 7 minutes for a total of 71 volumes, the first six of which were excluded in post-processing.

Data Processing

Phantom data was processed on a Sun Enterprise Server (Sun Microsystem, Mountain View, Calif.) using MATLAB (Mathworks, Natick, Mass.). Regions-of-interest (ROIs) were selected and mean and standard deviation of the signal intensities were calculated. The human data was processed on a personal computer, such as those using for example processors manufactured by INTEL Corporation, using BrainVoyager (Brain Innovation, Maastricht, the Netherlands). The two data sets using ascending and descending slice order were combined to minimize signal intensity difference among slices. Spatial filtering (FWHM=8 mm) was used to increase SNR, and signal time-courses were corrected for baseline drift on a voxel-by-voxel basis. After 3D motion correction, activation was detected using cross-correlation (t>2.7, p<0.01) between the signal time-course and a reference signal that combined the stimulus paradigm and the VASO hemodynamic response determined previously. A minimal cluster size of six neighboring voxels was applied, resulting in an overall statistical significance of p<0.005. Single-slice data were processed in a similar way. The SNR of each slice was calculated by averaging over all voxels inside the brain tissue.

Results

Figure 4A:
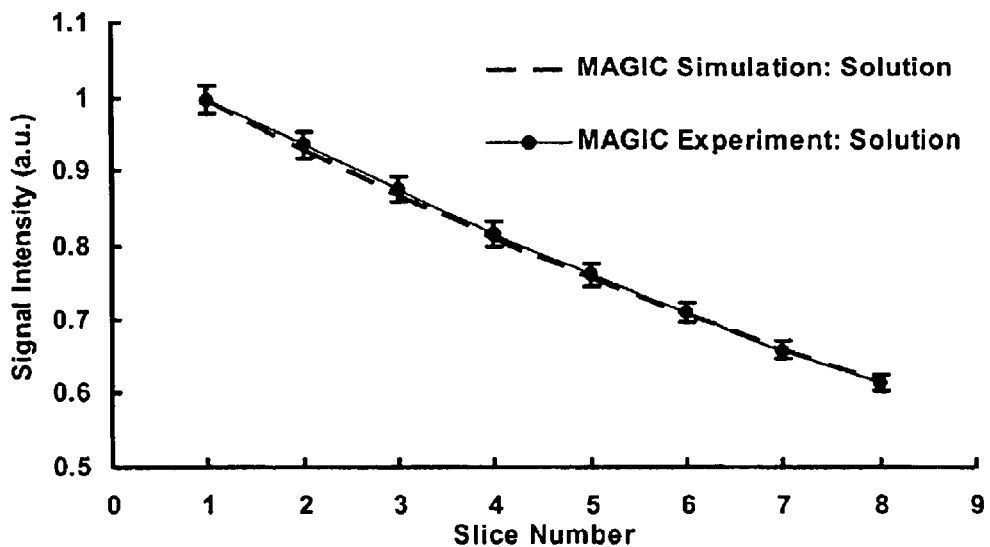
FIGS. 4A–B are graphs of simulation and experimental results on phantoms using MAGIC VASO without the initial inversion nulling. Signal intensities of a CuSO4 solution (FIG. 4A) and an CuSO4-doped agarose gel (FIG. 4B) are plotted as a function of slice number (error bar standard deviation). The solution signal shows a gradual decay, the rate of which matches well with the simulation results using the measured T1. However, the experimental signal decay in the gel is faster than predicted by simulations, consistent with magnetization transfer from the gel backbone to the water, resulting in a shorter apparent T1. This effect is also present in the brain, therefore resulting in a more rapid signal disappearance in successive slices.

There is shown in FIG. 4A a comparison of measured and simulated solution-phantom signal intensities as a function of slice number for the MAGIC sequence.

Figure 4B:
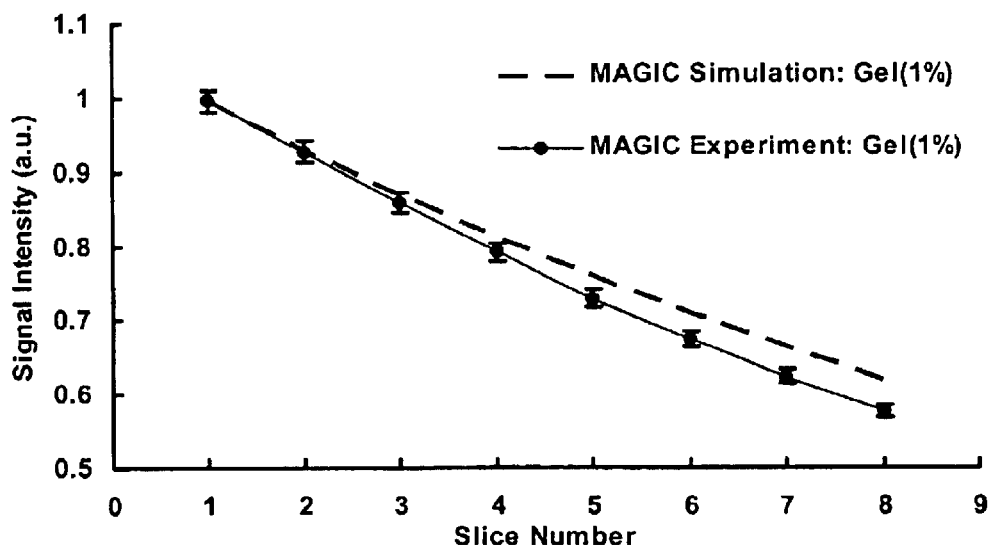

The simulation used the experimentally determined T1 (1020 ms). The experimental data shows a gradual signal decay, in excellent agreement with the one predicted by simulation. However, when applying the same approach to human studies, the experimental plot was found to decay at a faster rate than predicted using the proper brain T1 value (data not shown). To illustrate that such a difference could be due to the effects of magnetization transfer, experiments were performed on an agarose gel phantom (FIG. 4B), which is known to have magnetization transfer properties. It can be seen that discrepancy between the simulation and experimental results exists in these data, indicating a magnetization transfer effect due to the application of a series of inversion pulses, resulting in a shorter T1 app.

Figure 5A:
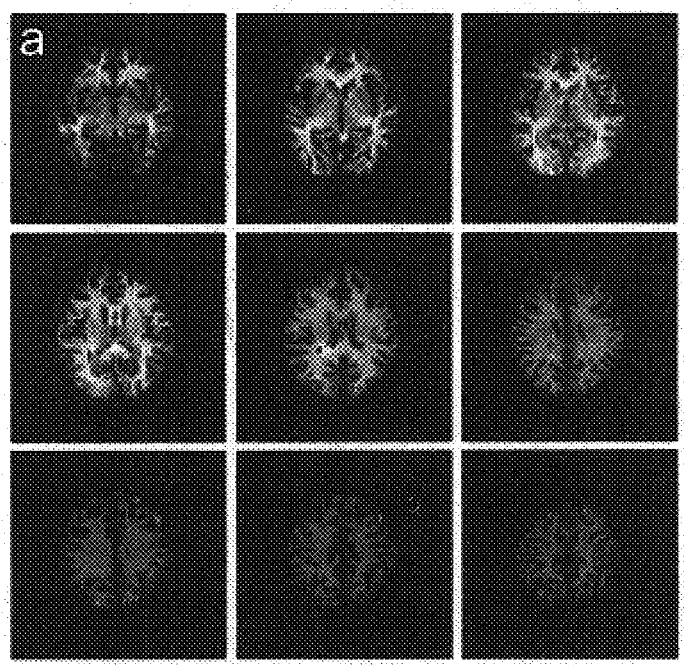
FIGS. 5A–C are various images using a Multi-slice (9 slices) MAGIC VASO technique where images using ascending (FIG. 5A) and descending (FIG. 5B) slice acquisition order show opposite signal decay patterns. After addition, the combined images (FIG. 5C) appear to have the same signal intensity in all slices.
Figure 5B:
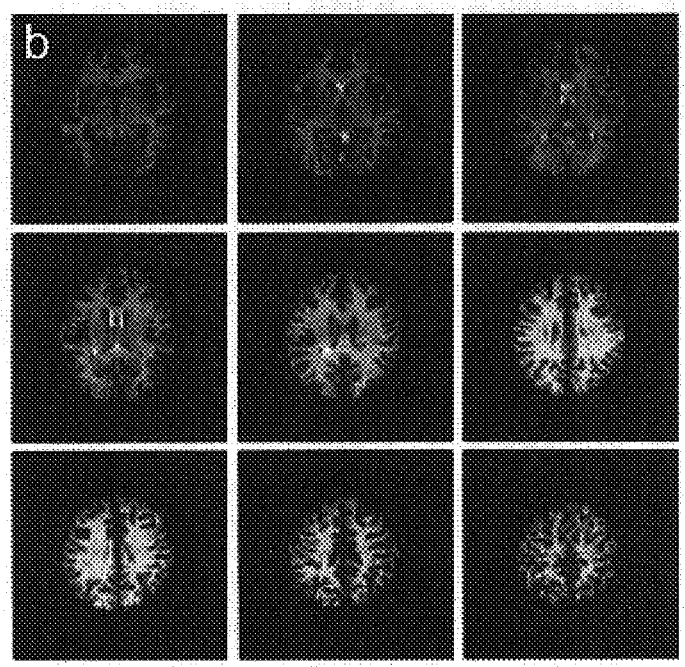
Figure 5C:
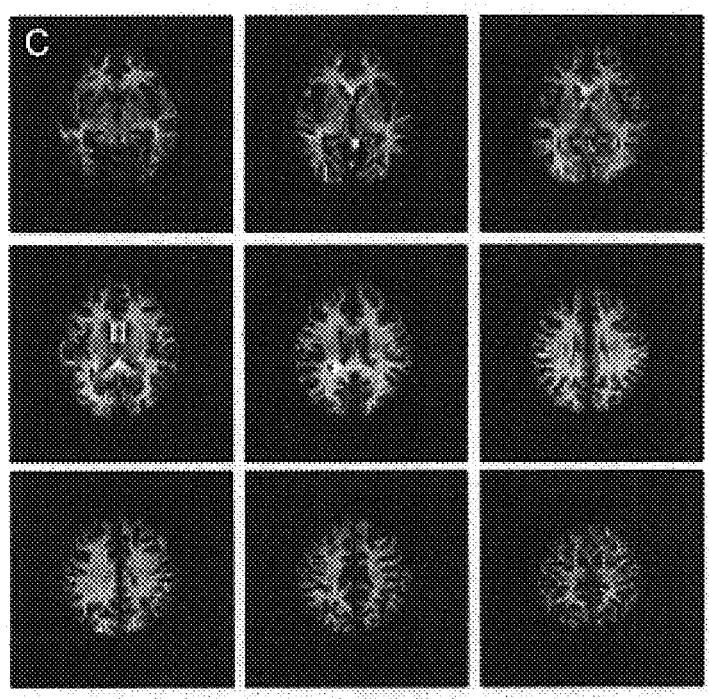
Figure 5D:
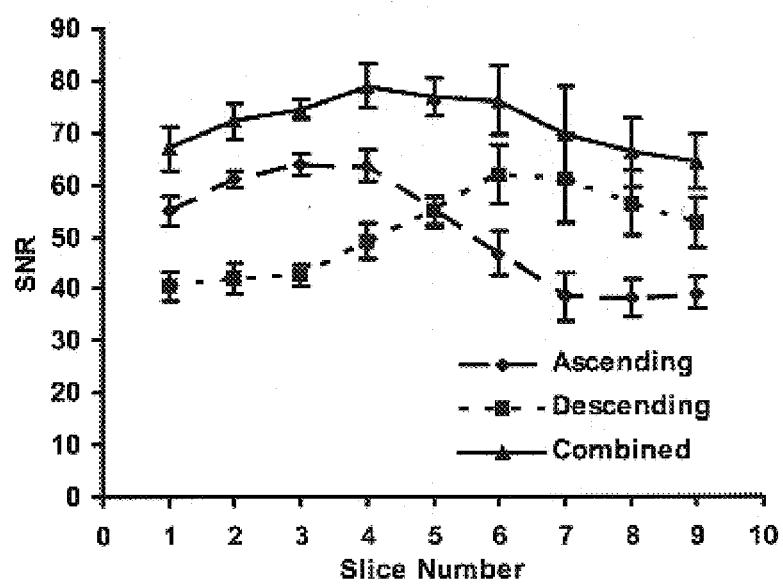
FIG. 5D is a graph illustrating the SNR (mean ±standard deviation, n=4, normalized over the number of voxels per slice) as a function of slice number. Ascending (dashed diamond) and descending (dotted square) show complementary curve shapes as expected. The combined data have a higher SNR due to averaging process, and the curve varies only slightly across the slices, which is attributed to different tissue composition (white matter has higher signal than gray matter in VASO images).

Referring now to FIGS. 5A–C, there is shown multi-slice VASO-fMRI images for the ascending-slice, descending-slice and combined functional data, respectively. It can be seen that the VASO contrast, i.e. the blood nulling effect, was achieved in all slices. The ascending and descending slices have opposite signal decay patterns, while the combined images have comparable intensity in all slices. There is shown in FIG. 5D the SNR (normalized over the number of voxels) of different slices in the three data sets. It should be noted that the shape of the signal decay in the ascending (dashed diamond) and descending (dotted square) data differs from the phantom results (FIG. 4), which is due to the acquisition of three slices within each 180°-180° interval in the human experiments. There are some remaining SNR differences between slices in the combined data (solid triangles, FIG. 5D) which appears to be related to the disparity in tissue composition across the slices, where the central slices often contain more white matter, which is brighter than gray matter due to shorter T1.

Figure 6A:
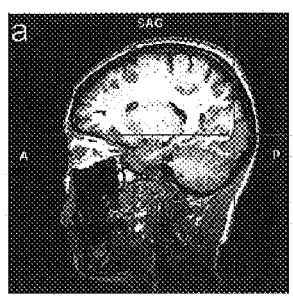
FIGS. 6A–C are respectively sagittal (FIG. 6A), coronal (FIG. 6B) and axial (FIG. 6C) activation maps (t>2.7, cluster>6, p<0.005), overlaid on high-resolution (1×1×1 mm$^3$) MPRAGE cross-sections. The locations of the cross-sections are indicated by red lines. The color bar denotes the range of t-values.
Figure 6B:
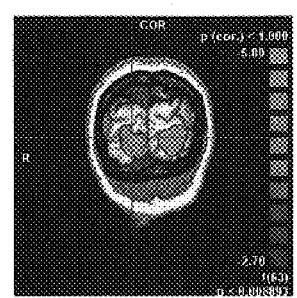
Figure 6C:
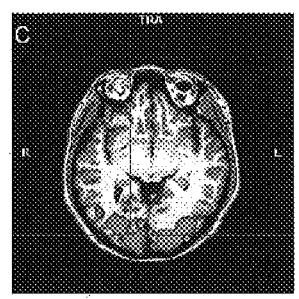

Referring now to FIGS. 6A–C, there is shown a sagittal (FIG. 6A), coronal (FIG. 6B), and axial (FIG. 6C) activation maps for multi-slice VASO-fMRI overlaid on high-resolution MPRAGE images. Bilateral activations can be seen in the occipital region corresponding to visual cortex. Note that blue-green colors, instead of red-yellow, were used in the maps to indicate a negative signal change, as opposed to the positive signal changes observed in BOLD or perfusion-based fMRI. To compare MAGIC-VASO to single-slice VASO, the central slice from the multi-slice VASO experiments was compared to the same slice acquired using the original single-slice approach in Table 1. It can be seen that, due to the averaging procedure over the two experiments, the SNR of the multi-slice method is 1.21±0.02 (mean ±standard deviation, n=4) times of the single-slice case, but is lower than $\sqrt{2}$ because of the MAGIC-related signal delay. The areas of the activated regions, however, were considerably larger (ratio of areas=1.93±0.36) in MAGIC-VASO (Table 1), indicating that not all of the activated voxels may have been detected in the single-slice case. When sufficient CNR is achieved, increased scan duration should only have a small effect on the number of activated voxels detected. Note also that spatial filtering (FWHM=8 mm) was used in data processing, which may decrease the accuracy of the activation area estimation.

Also, and referring now to FIG. 7 there is shown a high resolution images from a 3-D scan of a normal volunteer using a 3-D MAGIC-VASO technique. In the figure the reduced blood volume appears on the image as a high intensity spot.

TABLE 1

SNR and activation area comparison between the central slice in MAGIC VASO and the same slice acquired using single-slice VASO method

|  | Multi-slice SNR | Single-slice SNR | Multi-slice activated area (mm$^2$) | Single-slice activated area (mm$^2$) |
| --- | --- | --- | --- | --- |
| Subject 1 | 71.5[a] | 59.8 | 367 | 225 |
| Subject 2 | 79.7[a] | 64.9 | 1069 | 478 |
| Subject 3 | 78.5[a] | 65.1 | 872 | 464 |
| Subject 4 | 77.4[a] | 63.0 | 478 | 197 |

[a]scan duration is twice that of the single-slice due to the combination of ascending and descending acquisition order in the multi-slice case. For equal scan duration, the SNR in multi-slice is, on average, 86% of that in single-slice.

One interesting feature of the MAGIC-VASO images shown in FIGS. 5A–C is that fat artifacts are significantly suppressed by applying a single spectral-selective presaturation pulse (SPIR) in front of the first excitation pulse. This is in contrast to BOLD multi-slice sequences, where a SPIR pulse has to be applied before each slice excitation. The SPIR pulse at the beginning saturates the fat signal in all slices. As time goes on, the fat signal tends to recover toward equilibrium. However, due to the large bandwidth of the MAGIC inversion pulses (~2.5 kHz at 1.5 T), the fat magnetization is also inverted periodically and thus maintained around zero throughout the multi-slice acquisition.

Due to T1 relaxation during the MAGIC readout, the signal intensity decays as a function of slice number (black dots, FIGS. 2B, 3B). Therefore, two experiments were performed for MAGIC-VASO fMRI, one with ascending slice order and the other with descending order. By averaging these two data sets, one gets an image series that shows homogeneous signal intensity within each tissue type over the complete volume (FIG. 5). Note that such an acquisition scheme does not necessarily increase the scan time, because one can separate a functional experiment with n repetitions into two parts, of which n/2 repetitions will be acquired with ascending slice acquisition order and n/2 repetitions with descending order. However, the SNR will be slightly decreased using MAGIC compared to single-slice VASO with the same scan duration, the extent of which depends on the number of slices in the experiments. For instance, the SNR decrease for experiments with 9, 15 and 21 slices can be calculated to be 14%, 35% and 42%, respectively. However, these low SNR in VASO experiments can be reduced when using higher field strength (longer T1), more efficient data acquisition (e.g. parallel imaging approaches such as SENSE), or better coils (phased array, surface coils).

As compared to BOLD, motion correction is more difficult for MAGIC-VASO. Most motion correction algorithms assume a homogeneous sensitivity throughout the image volume and attempt to minimize the residual error by image translation and rotation. However, the MAGIC sequence has different sensitivities for different slices, and motion correction for multi-slice VASO-fMRI images is not as effective as for multi-slice BOLD images. Furthermore, 3D re-sampling of multi-slice MAGIC VASO images would result in mixing of signal of various strengths, with a potential introduction of stimulus correlated changes in signal intensity that would then be detected by statistical analyses. The present invention contemplates application of a smoothing filter before motion correction to minimize the sensitivity difference among slices, or the use of algorithms other than least-square error based methods to improve on this performance. In addition, using interleaved acquisitions in ascending and descending slice order can also reduce this problem. Compared to BOLD, one characteristics of the VASO image is the high contrast between gray and white matter (e.g., see FIG. 5), which is useful when overlaying activation maps on the functional EPI images. However, one disadvantage is that any residual motion can cause a relatively large fluctuation in the signal time-course and, if correlated with stimulation paradigm, it may create artifactual activations. This is similar to the situation in bolus-tracking CBV fMRI or BOLD fMRI experiments using a surface coil. In this study, a low-pass spatial filtering was applied to the data, which, in principle, may cause the motion fluctuation to spread to adjacent voxels and form a cluster. However, the activated regions in the acquired data were predominantly in the occipital cortex (FIG. 6) and not many dispersed activations in other cortices were observed, indicating that the residual motion was within tolerable range.

In MAGIC VASO, the addition of 180° pulses will increase the power deposition of the pulse sequence. However, due to the relatively long inversion time and recovery time, the overall SAR (0.4 when TR=2 s, 0.1 when TR=6 s) is still considerably lower than that of a typical fast spin-echo FLAIR sequence (SAR=1.5). To minimize energy deposition during the multi-slice acquisition period (200–400 ms), sync inversion pulses were used, instead of adiabatic pulses, for the MAGIC inversions so as to reduce the power.

When comparing FIGS. 2 and 3, acquisition of more than one slice (in the illustrated case, three) within each 180°-180° interval significantly decreases the time between slices (TS), thereby minimizing the signal decay in later slices. Moreover, such an acquisition scheme drastically reduces the number of 180° pulses required (by 67%), and thus the energy deposition in subjects, which is especially important at higher fields (e.g. $\geq 3$ T) when using a body coil. However, the 180°-180° interval should not be too long, since the blood signal may become too large and compromise the VASO contrast. In the experimental studies, an interval of 82 ms was used leading to a resulting blood signal of less than 3% of its equilibrium magnetization, which is comparable to residual blood signal caused by slight deviations of blood T1 from nominal values due to normal variation of hematocrit.

In the experimental studies, a body coil was used for RF transmission, which is expected to provide relatively homogeneous and effective inversion. However, when a smaller coil (e.g., head coil) is used, the imperfection of the inversion pulse can cause a faster signal decay as a function of slices. Although such a decay also can be corrected using ascending/descending combination, it will still result in a SNR loss. Thus RF transmission using a body coil was preferred in MAGIC VASO experiments. When a headcoil is used, it is preferably that adiabatic inversion pulses be used, particularly as the power deposition with a head coil is much less than with the body coil.

In the previous study concerning single-slice VASO FMRI, numerical simulation using a 4-compartment model showed that the proton exchange between tissue and capillaries had a very small effect on the VASO signal change. To evaluate the effects of capillary exchange for the MAGIC VASO technique, the model was modified to include the extra inversion pulses and performed simulation using similar parameters. In general, the proton exchange has a larger effect in slices acquired later. In the last slice ($9^{th}$ slice in this case), proton exchange was found to contribute 0.4%, 5.6%, and 10.9% of the total VASO signal for TR of 2 s, 3 s, and 6 s, respectively. This is much larger than the single-slice case, which is due to the outflow of exchanged tissue spins, causing a further signal loss when CBF is increased during activation. However, the exchange effect is still one order of magnitude less than the observed VASO signal and is similar to residual extravascular BOLD effect in amplitude but has an opposite sign.

Conclusion of Experimental Studies

A multi-slice VASO-fMRI technique was described using Multiple Acquisitions with Global Inversion Cycling. When using a series of non-selective 180° pulses to maintain the nulling of blood signal, the multi-slice VASO images showed clear blood nulling in all slices. A slight T1 signal decay as a function of increasing slice number could be corrected by combination of ascending-slice and descending-slice acquisition orders. The effect of this T1 decay will be reduced at high field and when using parallel imaging techniques such as SENSE. This multislice capability of VASO facilitates neuroscience and clinical applications of blood volume imaging.

Although a preferred embodiment of the invention has been described using specific terms, such description is for illustrative purposes only, and it is to be understood that changes and variations may be made without departing from the spirit or scope of the following claims.

Incorporation by Reference

All patents, published patent applications and other references disclosed herein are hereby expressly incorporated by reference in their entireties by reference.

What is claimed is:

1. A method for magnetic resonance imaging in which it is desired to eliminate MR signals of selected tissues, fluid or body components in a target area of an object to be imaged, comprising the steps of:
    applying an initial RF inversion pulse to invert the magnetization of the selected tissues, fluid or body component;
    successively applying one or more RF inversions pulses;
    applying a plurality of excitation pulses for acquisition of MR image data; and
    interleaving the application of the plurality excitation pulses and the application of the RF inversion pulses so that at least one of the plurality of excitation pulses follows in a time sequence the application of one of the applied RF inversion pulses.

2. A method for magnetic resonance imaging in which it is desired to eliminate MR signals of selected tissues, fluid or body components in a target area of an object to be imaged, comprising the steps of:
    applying an initial RF inversion pulse to invert the magnetization of the selected tissues, fluid or body component;
    successively applying one or more RF inversions pulses;
    acquiring MR image data; and
    sequencing the acquisition of MR image data so image data is being acquired following in a time sequence the application of one of the applied RF inversion pulses.

3. The method of claim 2, wherein said acquiring includes acquiring one of a plurality of slices or 3-dimensional MR image data following in a time sequence the application of one of the applied RF inversion pulses.

4. The method of claim 3, wherein said acquiring is performed such that one of the plurality of slices or 3-D image data acquisitions occurs at a time preceding the zero-crossing point for longitudinal magnetization of one of the applied inversion pulses and so each of the other of the plurality of slices and 3-D image data acquisitions occurs at or following the zero-crossing point for longitudinal magnetization of said one of the applied inversion pulses.

5. The method of any of claims 1 or 2, wherein the successively applied RF inversion pulses are applied in a time sequence so as to essentially maintain the magnetization of the selected tissues, fluid or body component at or about the zero-crossing point of the longitudinal magnetization.

6. The method of any of claims 1 or 2, wherein said successively applying includes successively applying a plurality or more of RF inversions pulses.

7. The method of claim 6, further comprising the steps of:
applying a plurality of excitation pulses for acquisition of MR image data; and
interleaving the application of the plurality excitation pulses and the application of the initial RF inversion pulse and the plurality of successively applied RF inversion pulses so that each of the plurality of excitation pulses follows in a time sequence the application of either of the initial RF inversion pulse or the plurality of successively applied RF inversion pulses.

8. The method of claim 6, further comprising the steps of:
acquiring MR image data; and
sequencing the acquisition of MR image data so image data is acquired following in a time sequence the application of either of the initial RF inversion pulse or the plurality of successively applied RF inversion pulses.

9. The method of claim 8, wherein said acquiring includes acquiring one of a plurality of slices or 3-dimensional MR image data following in a time sequence the application of either of the initial RF inversion pulse or the plurality of successively applied RF inversion pulses.

10. The method of claim 9, wherein said acquiring is performed such that one of the plurality of slices or 3-D image data acquisitions occurs at a time preceding the zero-crossing point for longitudinal magnetization of either of the initial RF inversion pulse or the plurality of successively applied RF inversion pulses and so each of the other of the plurality of slices and 3-D image data acquisitions occurs at or following said zero-crossing point for the longitudinal magnetization.

11. The method of claim 6, wherein the successively applied RF inversion pulses are applied in a time sequence so as to essentially maintain the magnetization of the selected tissues, fluid or body component at or about the zero-crossing point of the longitudinal magnetization.

12. A method for magnetic resonance imaging in which it is desired to eliminate MR signals of selected tissues, fluid or body components in a target area of an object to be imaged, comprising the steps of:
applying an initial RF inversion pulse of a T1 preparatory sequence of one of an inversion-recovery technique, a saturation recovery technique or a multiple-inversion-recovery technique;
successively applying one or more RF inversions pulses of the T1 preparatory sequence; and
interleaving the inversion pulses of the initial RF inversion pulse and the one or more successively applied inversion pulses with excitation pulses associated with MR imaging process so as to allow acquisition of MR image data at or about a condition where signals from the selected tissues, fluid or body components are minimized and so as to essentially not contaminate other MR signals being acquired from the target area.

13. A method for magnetic resonance imaging in which it is desired to eliminate MR signals of selected tissues, fluid or body components in a target area of an object to be imaged, comprising the steps of:
applying an initial RF inversion pulse of a T1 preparatory sequence of one of an inversion-recovery technique, a saturation recovery technique or a multiple-inversion-recovery technique;
successively applying one or more RF inversions pulses of the T1 preparatory sequence; and
interleaving the inversion pulses of the initial RF inversion pulse and the one or more successively applied inversion pulses with excitation pulses associated with MR imaging process so as to allow acquisition of MR image data at or about a condition where signals from the selected tissues, fluid or body components are being maintained essentially nulled.

14. The method of claim 13, wherein the inversion recovery technique includes one of FLAIR, STIR, bright blood coronary angiography or VASO and the multiple-inversion recovery technique includes black-blood angiography.

15. The method of either of claim 12 or 13, wherein said interleaving includes interleaving the inversion pulses and the excitation pulses so as to acquire one of a plurality of slices or 3-dimensional MR image data following in a time sequence the application of one of the applied RF inversion pulses.

16. The method of claim 15, wherein said interleaving is performed such that one of the plurality of slices or 3-D image data acquisitions occurs at a time preceding the zero-crossing point for longitudinal magnetization of one of the applied inversion pulses and so each of the other of the plurality of slices and 3-D image data acquisitions occurs at or following the zero-crossing point for longitudinal magnetization of said one of the applied inversion pulses.

17. The method of either of claim 12 or 13, wherein the successively applied RF inversion pulses are applied in a time sequence so as to essentially maintain the magnetization of the selected tissues, fluid or body component at or about the zero-crossing point of the longitudinal magnetization.

18. The method of any of claim 1, 2, 12 or 13, wherein said successively applying one or more RF inversions pulses includes alternating phases of each of the successively applied RF inversion pulses, thereby minimizing the effect of inversion imperfection.

19. The method of any of claim 1, 2, 12 or 13, wherein said successively applying one or more RF inversions pulses includes applying a multi-direcitonal de-phasing 0 gradient cycle scheme, thereby minimizing stimulated echo formation caused by non-180° character of inversion pulses.

20. A magnetic resonance imaging system comprising:
a RF transmitter apparatus that is configured and arranged to generate RF signals having a predetermined frequency for inverting magnetization and for generating RF signals to excite the nuclei in a target region of an object to be imaged and so the generated signal pulses are applied to a target region of an object to be imaged;
a controller operably coupled to the RF transmitter apparatus, the controller being configured and arranged so as to selectively generate the RF inversion pulses in manner so as to essentially null signals from one or more selected constituents in the target region and so as to interleave the RF inversion pulses and the RF excitation pulses so that MR image data is acquired while the controller is maintaining the nulling of signals from the selected one or more constituents.

* * * * *